(12) United States Patent
Qawami et al.

(10) Patent No.: US 11,068,183 B2
(45) Date of Patent: **\*Jul. 20, 2021**

(54) MEMORY ACCESS TECHNIQUES IN MEMORY DEVICES WITH MULTIPLE PARTITIONS

(71) Applicant: Micron Technology, Inc., Boise, ID (US)

(72) Inventors: Shekoufeh Qawami, El Dorado Hills, CA (US); Rajesh Sundaram, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 83 days.

This patent is subject to a terminal disclaimer.

(21) Appl. No.: 16/103,697

(22) Filed: Aug. 14, 2018

(65) Prior Publication Data

US 2019/0004729 A1    Jan. 3, 2019

Related U.S. Application Data

(63) Continuation of application No. 15/145,628, filed on May 3, 2016, now Pat. No. 10,152,262.

(51) Int. Cl.
*G06F 12/00* (2006.01)
*G06F 13/00* (2006.01)
(Continued)

(52) U.S. Cl.
CPC ............ *G06F 3/0644* (2013.01); *G06F 3/061* (2013.01); *G06F 3/0655* (2013.01);
(Continued)

(58) Field of Classification Search
CPC ...... G06F 3/0644; G06F 3/061; G06F 3/0655; G06F 3/0679
(Continued)

(56) References Cited

U.S. PATENT DOCUMENTS 5,263,003 A * 11/1993 Cowles ................ G11C 7/1027
365/185.11
5,390,317 A * 2/1995 Weiss .................. G06F 12/1433
365/185.04
(Continued)

FOREIGN PATENT DOCUMENTS

EP          0932102 A1    7/1999
JP          05250309 A    9/1993
(Continued)

OTHER PUBLICATIONS

KIPO, "Office Action," issued in connection with Korean Patent Application No. 10-2018-7033882, dated Apr. 23, 2019 (9 pages).
(Continued)

*Primary Examiner* — Sheng Jen Tsai
(74) *Attorney, Agent, or Firm* — Holland & Hart LLP

(57) ABSTRACT

Methods, systems, and devices for operating a memory array are described. A memory controller may be configured to provide enhanced bandwidth on a command/address (C/A) bus, which may have a relatively low pin count, through use of a next partition command that may repeat an array command from a current partition at a different partition indicated by the next partition command. Such a next partition command may use fewer clock cycles than a command that includes a complete instruction and memory location information.

20 Claims, 10 Drawing Sheets

| Pin | Command Address Cycle | | | | | | | |
|-----|---|---|---|---|---|---|---|---|
|     | 0 | 1 | 2 | 3 | 4 | 5 | 6 | 7 |
| CA4 | CMD3 | RFU | RFU | MA | MA | MA | MA | MA |
| CA3 | CMD2 | PA3 | RFU | MA | MA | MA | MA | MA |
| CA2 | CMD1 | PA2 | RFU | MA | MA | MA | MA | MA |
| CA1 | CMD0 | PA1 | RFU | MA | MA | MA | MA | MA |
| CA0 | RFU | PA0 | MA | MA | MA | MA | MA | MA |

300

| CMD | Command Bits |
| PA  | Partition Address Bits |
| MA  | Memory Address Bits |
| RFU | Reserved Bits for Future Use |

(51) Int. Cl.
*G06F 3/06* (2006.01)
*G11C 13/00* (2006.01)

(52) U.S. Cl.
CPC .......... *G06F 3/0679* (2013.01); *G11C 13/003* (2013.01); *G11C 13/0004* (2013.01); *G11C 13/0061* (2013.01); *G11C 2213/71* (2013.01)

(58) Field of Classification Search
USPC ........................................................ 711/101
See application file for complete search history.

(56) References Cited

U.S. PATENT DOCUMENTS

| | | | | |
|---|---|---|---|---|
| 5,758,191 | A * | 5/1998 | Kasebayashi | G06F 3/061 710/29 |
| 6,085,280 | A * | 7/2000 | Zink | G11C 7/1039 711/127 |
| 6,108,243 | A * | 8/2000 | Suzuki | G11C 7/1018 365/189.14 |
| 6,128,716 | A * | 10/2000 | Biggs | G06F 13/1631 711/169 |
| 6,853,382 | B1 * | 2/2005 | Van Dyke | G06F 13/161 345/502 |
| 7,243,183 | B2 | 7/2007 | Hsieh et al. | |
| 7,925,854 | B2 | 4/2011 | Oh et al. | |
| 8,626,989 | B2 * | 1/2014 | Van Aken | G06F 12/0246 711/103 |
| 8,830,743 | B2 | 9/2014 | Cho et al. | |
| 8,853,818 | B2 | 10/2014 | Lue | |
| 8,914,589 | B2 * | 12/2014 | Gregorius | G06F 13/1663 711/153 |
| 9,053,976 | B2 | 6/2015 | Ernst et al. | |
| 9,246,100 | B2 | 1/2016 | Ravasio et al. | |
| 9,311,976 | B2 | 4/2016 | Ware et al. | |
| 9,342,471 | B2 * | 5/2016 | Miller | G06F 13/1647 |
| 9,354,823 | B2 | 5/2016 | Miller et al. | |
| 9,397,145 | B1 * | 7/2016 | Sills | H01L 27/2481 |
| 9,417,816 | B2 * | 8/2016 | Roberts | G06F 3/0659 |
| 9,645,938 | B2 | 5/2017 | Kranich et al. | |
| 10,152,262 | B2 * | 12/2018 | Qawami | G06F 3/061 |
| 2003/0214854 | A1 * | 11/2003 | Imondi | G11C 7/1021 365/200 |
| 2006/0155910 | A1 * | 7/2006 | Hsieh | H04J 3/1611 711/5 |
| 2007/0089030 | A1 * | 4/2007 | Beracoechea | H04L 49/90 714/762 |
| 2008/0140899 | A1 * | 6/2008 | Oh | G06F 12/0653 710/300 |
| 2008/0140916 | A1 * | 6/2008 | Oh | G06F 13/4239 711/103 |
| 2008/0301391 | A1 * | 12/2008 | Oh | G06F 13/28 711/167 |
| 2012/0265927 | A1 * | 10/2012 | Cho | G11C 11/5642 711/103 |
| 2013/0262737 | A1 | 10/2013 | Nakanishi | |
| 2013/0332681 | A1 * | 12/2013 | Miller | G06F 3/0659 711/154 |
| 2015/0029775 | A1 * | 1/2015 | Ravasio | H01L 45/1666 365/63 |
| 2015/0287916 | A1 * | 10/2015 | Campbell | H01L 45/1233 257/5 |
| 2015/0347027 | A1 * | 12/2015 | Lu | G06F 3/0611 711/103 |
| 2016/0351234 | A1 * | 12/2016 | Perego | G06F 13/1678 |
| 2017/0097782 | A1 * | 4/2017 | Ramalingam | G06F 3/0616 |
| 2017/0123995 | A1 * | 5/2017 | Freyensee | G06F 12/10 |
| 2017/0125097 | A1 * | 5/2017 | Tortorelli | G11C 13/004 |
| 2017/0161073 | A1 * | 6/2017 | Chen | G06F 11/3632 |

FOREIGN PATENT DOCUMENTS

| | | |
|---|---|---|
| JP | 10172283 A | 6/1998 |
| JP | 2013205872 A | 10/2013 |
| KR | 20160033737 A | 3/2016 |
| TW | 489265 B | 6/2002 |
| WO | 2014209891 A1 | 12/2014 |
| WO | 2015047348 A1 | 4/2015 |

OTHER PUBLICATIONS

ISA/KR, International Search Report and Written Opinion of the International Searching Authority, Int'l Appl. No. PCT/US2017/028177, dated Jul. 20, 2017, Korean Intellectual Property Office, Seo-gu, Daejon, Republic of Korea, 12 pgs.

Japanese Patent Office, "Office Action," issued in connection with Japanese Patent Application No. 2018-557135, dated Jun. 11, 2019 (3 pages).

European Patent Office, "European Search Report," issued in connection with European Patent Application No. 17792993.2, dated Dec. 12, 2019 (11 pages).

Japan Patent Office, "Notice of Rejection Ground," issued in connection with Japanese Patent Application No. 2020-047575, dated Mar. 2, 2021 (4 pages).

\* cited by examiner

| Pin | Command Address Cycle | | | | | | | |
|-----|------|------|------|----|----|----|----|----|
|     | 0    | 1    | 2    | 3  | 4  | 5  | 6  | 7  |
| CA4 | CMD3 | RFU  | RFU  | MA | MA | MA | MA | MA |
| CA3 | CMD2 | PA3  | RFU  | MA | MA | MA | MA | MA |
| CA2 | CMD1 | PA2  | RFU  | MA | MA | MA | MA | MA |
| CA1 | CMD0 | PA1  | RFU  | MA | MA | MA | MA | MA |
| CA0 | RFU  | PA0  | MA   | MA | MA | MA | MA | MA |

CMD — Command Bits

300

PA — Partition Address Bits

MA — Memory Address Bits

RFU — Reserved Bits for Future Use

MEMORY ACCESS TECHNIQUES IN MEMORY DEVICES WITH MULTIPLE PARTITIONS

CROSS REFERENCE

The present Application for Patent is a continuation of U.S. patent application Ser. No. 15/145,628 by Qawami et al., entitled "Memory Access Techniques In Memory Devices With Multiple Partitions," filed May 3, 2016, assigned to the assignee hereof, and is expressly incorporated by reference herein.

BACKGROUND

The following relates generally to memory devices and more specifically to efficient memory access techniques in memory devices with multiple partitions.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), 3D cross-point (3DXP) memory, and others. Memory devices may be volatile or non-volatile. Non-volatile memory, e.g., PCM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

Memory devices also may store data in a number of different partitions within the memory device. Each partition may include memory cells and other logic, such as controller logic and data buffers, for example. Each partition may read or write independently, allowing multiple partitions to be accessed concurrently. When accessing a memory device, a memory controller may use a memory address for one or more memory cells in a partition along with a command, such as a read command, write command, refresh command, etc. Memory devices that are used for relatively long term storage (e.g., a solid state drive, hard drive, optical drive, etc.) are often referred to as "storage" subsystems, and a lower bandwidth bus having a relatively small pin count may be used to couple such storage subsystems with a processor. Memory devices that are used for relatively short-term storage (e.g., cache or random access memory) are often referred to as "memory" subsystems, and a higher bandwidth bus having relatively a relatively large pin count may be used to couple such memory subsystems with a processor. In some systems, a command may be sent to a storage subsystem over multiple clock cycles using a lower bandwidth bus, and a similar command sent to a memory subsystem may use fewer clock cycles over a higher bandwidth bus.

Phase change memory and 3DXP memory are a relatively new memory class, may be non-volatile, and may offer improved read/write speeds and endurance compared to other memory devices. Such memory devices may, in some cases, be used in memory subsystems or storage subsystems. In some cases, providing phase change or 3DXP memory devices having different bus architectures may be technologically unfeasible or cost prohibitive. Instead, other techniques for command and data transfer may reduce memory device cost or increase performance.

BRIEF DESCRIPTION OF THE DRAWINGS

The disclosure herein refers to and includes the following figures.

DETAILED DESCRIPTION

Figure 1:
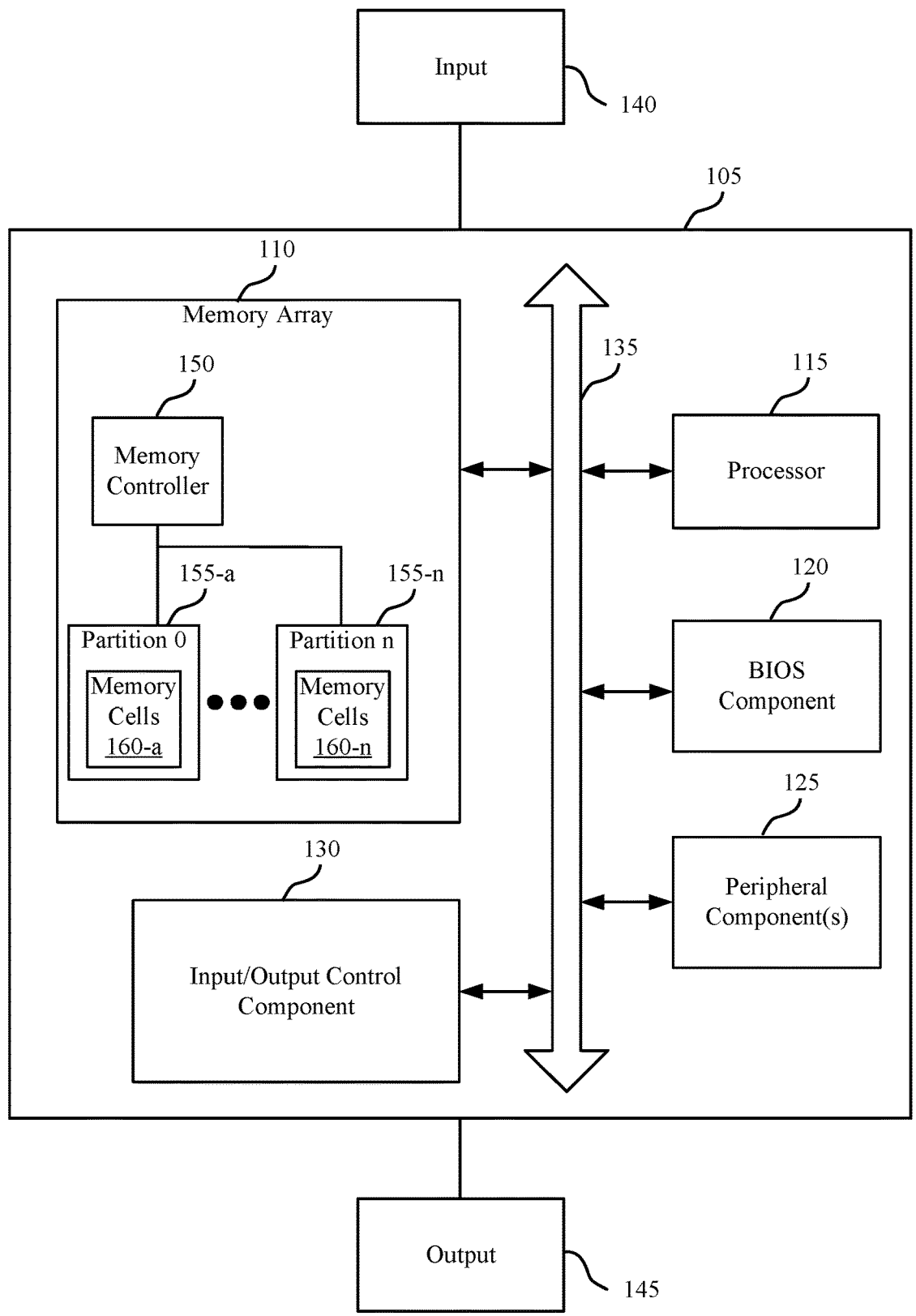
FIG. 1 illustrates a system, including a memory array with multiple partitions, that supports memory access techniques in memory devices with multiple partitions in accordance with various embodiments of the present disclosure

Disclosed apparatuses and techniques are provided for efficient access to memory devices having multiple partitions of memory cells. As indicated above, memory devices that operate in storage subsystems may have different requirements than memory devices that operate in memory subsystems. As also indicated above, a, 3D cross-point (3DXP) memory may be used in some computing platforms in either a memory subsystem or storage subsystem. Various embodiments of the present disclosure provide techniques for enhancing the efficiency of a command/address (C/A) bus coupled with a memory device having multiple partitions such that a same memory device die may be used in either memory subsystems or storage subsystems.

In some embodiments, a memory device may have multiple partitions of memory cells, and each partition of memory cells may include a number of different memory locations. The number of memory locations for each partition may be the same across the multiple partitions of memory cells. The memory device, in some embodiments, may be selected from a group consisting of dynamic random access memory (DRAM), non-volatile random access memory (NVRAM), read only memory (ROM), and 3DXP memory. A command and an associated memory location address may be provided to an operation instruction decoder associated with the memory device that may instruct the memory device to perform a first action at the provided memory location of a first partition. In some embodiments, an operation instruction decoder may be included in a local controller associated with a particular memory partition, may be included in a memory controller associated with multiple memory partitions, or may be in a controller separate from memory partitions. In some embodiments, a subsequent command may include a "next partition" command to perform the first action at a same memory location of a second memory partition as the memory location of the first partition that was provided in the previous command.

Such techniques may provide a memory device that may function in either a memory subsystem or a storage subsystem by reducing the number of clock cycles associated with memory commands that are repeated across multiple partitions, thus providing a memory with a higher bandwidth while having a relatively low pin count for the C/A bus. Such techniques may enhance C/A bus efficiency, in some examples, for sequential read commands and write commands by providing that the addresses and command do not need to be repeated. This may provide additional C/A bus cycles for use in other operations and device management.

Features and techniques introduced above are further described below in the context of a memory array. Specific examples are then described for memory access techniques in 3DXP memory devices with multiple partitions. These and other features of the disclosure are further illustrated by and described with reference to apparatus diagrams, system diagrams, and flowcharts that relate to memory access techniques in memory devices with multiple partitions.

FIG. 1 shows a diagram of a system 100 that supports efficient memory access in memory devices with multiple partitions in accordance with various embodiments of the present disclosure. System 100 may include a device 105, which may be or include a printed circuit board to connect or physically support various components. Device 105 may include a memory array 110. Memory array 110 may contain memory controller 150, multiple memory partitions 155, including memory partition 0 155-*a* through memory partition n 155-*n*. Each memory partition 155 may include memory cells 160. Device 105 may also include a processor 115, BIOS component 120, peripheral component(s) 125, and input/output control component 130. The components of device 105 may be in electronic communication with one another through bus 135.

Processor 115 may be configured to operate memory array 110 through memory controller 150. In some cases, processor 115 performs the functions of memory controller 150. In other cases, memory controller 150 may be integrated into processor 115. Processor 115 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 115 may perform various functions described herein, including efficient memory access techniques for access memory locations across the multiple partitions 155. Processor 115 may, for example, be configured to execute computer-readable instructions stored in memory array 110 to cause device 105 perform various functions or tasks.

BIOS component 120 may be a software component that includes a basic input/output system (BIOS) operated as firmware, which may initialize and run various hardware components of system 100. BIOS component 120 may also manage data flow between processor 115 and the various components, e.g., peripheral components 125, input/output control component 130, etc. BIOS component 120 may include a program or software stored in read-only memory (ROM), flash memory, or any other non-volatile memory.

Peripheral component(s) 125 may be any input or output device, or an interface for such devices, that is integrated into device 105. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 130 may manage data communication between processor 115 and peripheral component(s) 125, input 140, or output 145. Input/output control component 130 may also manage peripherals not integrated into device 105. In some cases, input/output control component 130 may represent a physical connection or port to the external peripheral.

Input 140 may represent a device or signal external to device 105 that provides input to device 105 or its components. This may include a user interface or interface with or between other devices. In some cases, input 140 may be a peripheral that interfaces with device 105 via peripheral component(s) 125 or may be managed by input/output control component 130.

Output 145 may represent a device or signal external to device 105 configured to receive output from device 105 or any of its components. Examples of output 145 may include data or signals sent to a display, audio speakers, a printing device, another processor or printed circuit board, etc. In some cases, output 145 may be a peripheral that interfaces with device 105 via peripheral component(s) 125 or may be managed by input/output control component 130.

The components of memory controller 150, device 105, and memory array 110 may be made up of circuitry designed to carry out their functions. This may include various circuit elements, for example, conductive lines, transistors, capacitors, inductors, resistors, amplifiers, or other active or inactive elements, configured to carry out the functions described herein.

In some embodiments, the memory array 110 may be a 3DXP die that is flexible for use in both memory subsystems and storage subsystems, and the device 105 may be integrated with or operate as a memory subsystem or storage subsystem. The memory array 110 may interface with bus 135 through a multi-clock-cycle C/A bus. The memory controller 150 may be configured to provide enhanced bandwidth on the C/A bus, which may have a relatively low pin count, through use of a next partition command that may repeat the array command from current partition, such as partition 0 155-*a*, with all the same address bits at different partition, such as partition n 155-*n*, specified by the next partition command. Such a next partition command may use fewer clock cycles than a command that includes a complete instruction and memory location information, as discussed in more detail herein.

Figure 2:
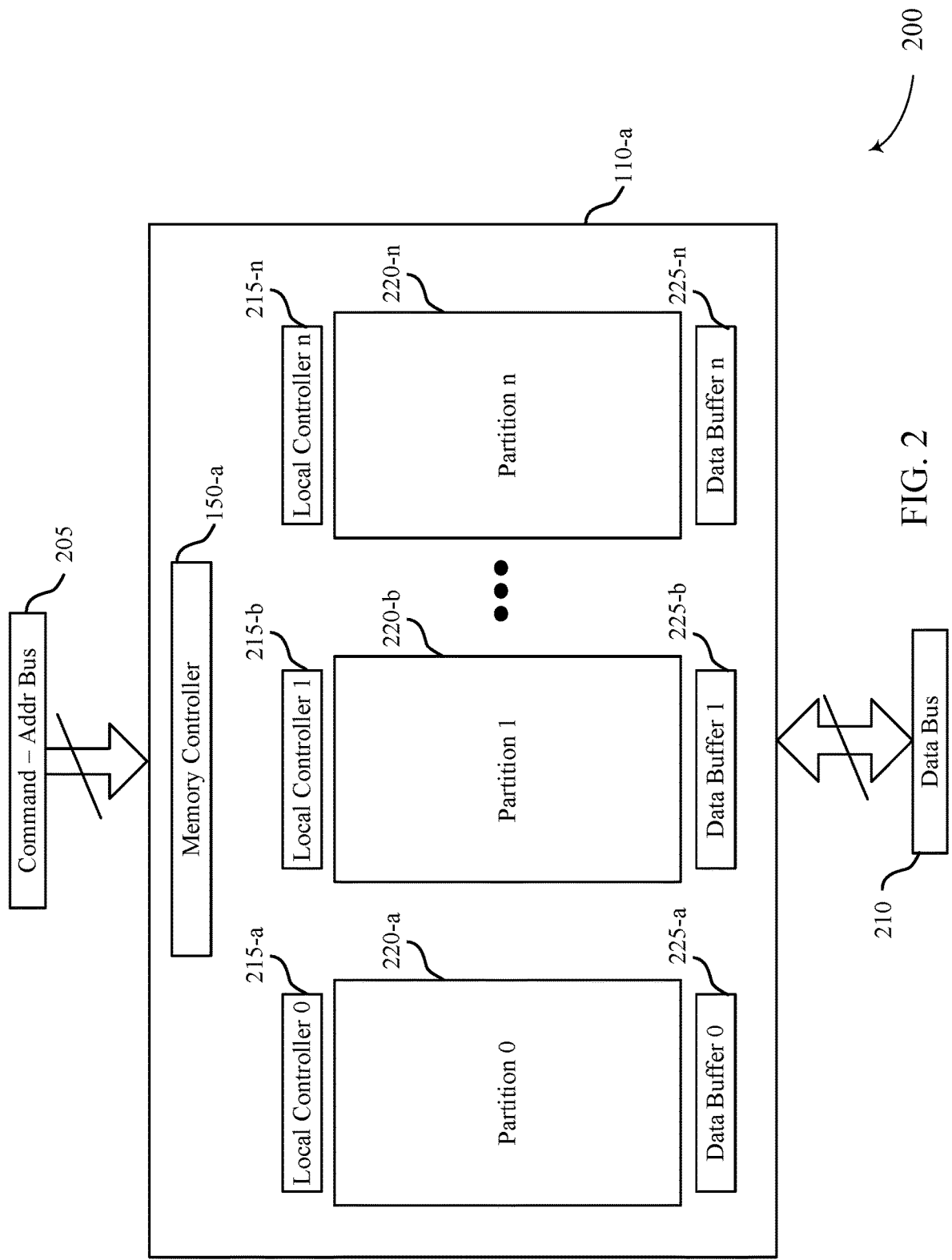
FIG. 2 illustrates an example memory device having multiple partitions that supports memory access techniques in accordance with various embodiments of the present disclosure.

FIG. 2 illustrates an example memory device 200 having multiple partitions that supports memory access techniques in accordance with various embodiments of the present disclosure. The memory device 200 in this example may interface with a command/address (C/A) bus 205 and a data bus 210. As indicated above, it may be desirable to maintain a relatively low pin count on the C/A bus 205, which may be used to provide command information and memory address information associated with the command information. In some examples, the C/A bus 205 may include five pins, and commands and addresses may be communicated via the C/A bus 205 over multiple clock cycles. The data bus 210, in some examples, may include eight pins and may be used to communicate data to and from memory array 110-a. The memory array 110-a, which may be an example of memory array 110 of FIG. 1, may include a memory controller 150-a, which may be an example of memory controller 150-a of FIG. 1. The memory array 110-a may also include a number of partitions 220-a through 220n, which may be examples of partitions 155 of FIG. 1. Each partition 220 may have an associated local controller 215 and an associated data buffer 225.

In some embodiments, the memory array 110-a is a 3DXP memory array in which each partition 220 is a one gigabyte partition, and the device includes 16 partitions. In some examples, memory within each partition 220 may be accessed at a granularity of 16 bytes, and thus 26 bits of memory address information are provided to the memory array 110-a via the C/A bus 205. Furthermore, in this example, four bits may be used to provide partition identification via the C/A bus 205. Additionally, in some examples, up to 16 commands or instructions may be used for operation of the memory array 110-a, and thus four bits may be used to send a command or instruction to the memory array 110-a via the C/A bus 205. Accordingly, in this example, 34 bits of information may be provided via the C/A bus 205 to the memory array 110-a in a full command and address operation. Of course, the particular partition sizes, numbers of partitions, and bits used for command and address operations described above are provided for one example only, and different partition sizes, numbers of partitions, and command/address bits may be used in other embodiments.

As indicated above, in some embodiments a next partition command may be included as one command that may be provided via the C/A bus 205. The next partition command may, in some examples, include only the command bits and partition address that are sent via the C/A bus 205. The memory controller 150-a, which may include an operation instruction decoder, alone or in conjunction with a local controller 215, which also may include an operation instruction decoder, may receive the next partition command and an indication of the partition on which the next partition command is to be used. For example, the memory controller 150-a, alone or in conjunction with local controller 215, may receive the next partition command and the partition information, and may perform a command from a prior instruction at a memory location of the partition indicated in the next partition command that was provided in the prior instruction. Accordingly, the next partition command of embodiments does not provide a memory address, and thus the bits associated with the memory address are not transmitted. In some embodiments, the memory controller 150-a may simply perform the next partition command on a next sequential partition from a prior command, in which case the next partition command may only include the command bits. In further embodiments, the next partition command may include a one bit indicator that may indicate that the command is to be performed on a next sequential partition or that the partition address for the next partition command will follow the next partition command.

As mentioned, in some examples the memory address is 26 bits, and the C/A bus 205 is a 5-bit bus. Thus, in these examples, the next partition command may save clock cycles on the C/A bus 205. In some embodiments, the memory controller 150-a, or another controller external of the memory array 110-a, may perform sequential write operations at the memory array 110-a at the same memory locations of sequential partitions 220. Thus, when performing write operations across multiple partitions 220, a significant number of clock cycles of the C/A bus 205 may be eliminated through the use of the next partition command. For example, if data is received at memory controller 150-a that is to be written across 12 memory locations, the memory controller 150-a may perform 12 writes to a same memory location across 12 different partitions 220. Thus, in this example, an initial instruction may include the write command, partition address, and memory address for the initial data write, and each of the eleven subsequent commands may simply be next partition commands with the next partition instruction and partition address. Thus, using the next partition command in such an example will reduce the total number of necessary clock cycles from 84 (i.e., 7 clock cycles for 12 consecutive commands) to 29 (i.e., 7 clock cycles for the first command followed by 11 two-clock-cycle next partition commands), significantly enhancing the throughput of the C/A bus 205. In one embodiment, as will be discussed in more detail below, a full command and address (e.g., including a memory address, partition address, and command instruction) operation may use eight clock cycles on the C/A bus 205 and the next partition command may use two clock cycles on the C/A bus. Thus, in this embodiment, using the next partition command of the above example will reduce the total number of necessary clock cycles from 96 (i.e., 8 clock cycles for 12 consecutive commands) to 30 (i.e., 8 clock cycles for the first command followed by 11 two-clock-cycle next partition commands), also significantly enhancing the throughput of the C/A bus 205. In embodiments that perform the next partition command on a next sequential memory partition, and thus do not include a memory partition address, this may be further reduced to 19 clock cycles (i.e., 8 clock cycles for the first command followed by 11 one-clock-cycle next partition commands).

Figure 3:
FIG. 3 illustrates an example control/address bus pins and command address cycles for memory devices in accordance with various embodiments of the present disclosure.
Figure 3:
Figure 3:
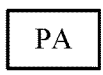
Figure 3:
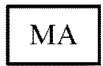
Figure 3:

As indicated above, in some embodiments a full command and address may use eight clock cycles of the C/A bus. FIG. 3 illustrates such an example of control/address bus pins and command address cycles for memory devices in accordance with various embodiments of the present disclosure. In the example of FIG. 3, the C/A bus has five pins, namely CA0 through CA4. Thus, for each clock cycle of the C/A bus, five bits may be transferred to a memory array. As indicated above, in various embodiments, the memory array may have multiple partitions, and in some embodiments the memory array may be a 3DXP memory array that has 16 partitions, each partition including one gigabyte of memory accessed at a granularity of 16 bytes. In such embodiments, 26 bits of information may be used to provide a memory address, and four bits of information may be used to provide a partition address. In the example of FIG. 3, four bits of information are used to provide a command to the memory array, indicated as CMD0 through CMD3, which may be transmitted in a first command/address clock cycle via the C/A bus. Following the command bits, in this example, are two bits of information that are reserved for future use (RFU) and then four partition address bits PA0 through PA3 that are transmitted in a second command/address clock cycle via the C/A bus. In the example of FIG. 3, four more RFU bits are then provided, followed by 26 bits of memory address (MA) information that are transmitted in the third through eighth command/address clock cycles via the C/A bus. Thus, in the example of FIG. 3, 40 bits of information are provided to a memory array over eight clock cycles of a C/A bus, for a memory operation.

As discussed above, embodiments of the present disclosure provide a "next partition" command, in which only the command bits CMD0 through CMD3, and partition address bits PA0 through PA3, are transmitted via the C/A bus for sequential memory operations a same memory address at different partitions. Accordingly, such a next partition command may be transmitted to the memory array using two clock cycles of the C/A bus. Thus, in examples where the C/A bus is five bits wide, the next partition command may be provided via 10 bits of information, or a 75% decrease from the number of bits associated with a full memory command and address information which would take 8 clock cycles and 40 bits of information. In embodiments where a memory controller may simply perform the next partition command on a next sequential partition, the number of bits may be even further reduced. In some embodiments, a memory controller may store information provided by sequential write operations at a same memory address in different memory array partitions in order to enhance the likelihood that a next partition command may be used for subsequent sequential read operations. Such techniques may significantly reduce the number of data bits that need to be sent on the C/A bus, and hence commands can be processed faster and at lower energy by minimizing toggle on C/A bus. Furthermore, in some embodiments the C/A bus may be shared among many devices, and benefits of techniques such as provided herein provide further benefits through enhanced C/A bus efficiency, as inefficiency in the C/A bus might affect device output and sustaining of maximum bandwidth the C/A bus, a data bus, or combinations thereof, across multiple devices.

Figure 4:
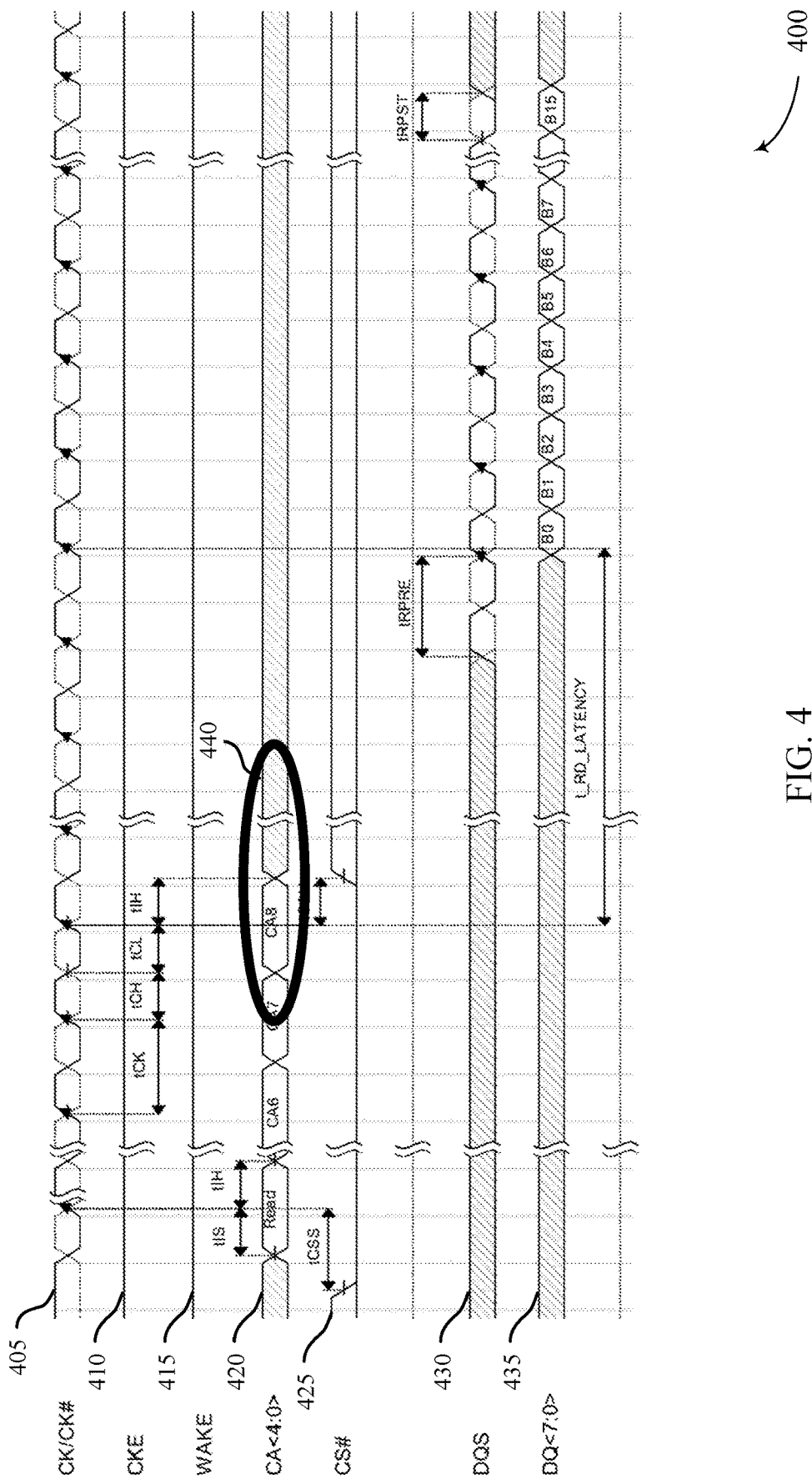
FIG. 4 illustrates an example of a timing diagram for control/address bus pins using a full command and address transmission in accordance with various embodiments of the present disclosure.

FIG. 4 illustrates an example of a timing diagram 400 for control/address bus pins using a full command and address transmissions. Such a timing diagram 400 may represent timing associated with a memory array 110 of FIG. 1 or 2. A clock (CK/CK #) signal 405 may be provided to the memory array, along with a clock enable (CKE) signal 410 and a wake signal 415. C/A bus signal 420, which is five bits wide, is also provided to the memory array. A chip select (CS #) signal 425, and data strobe (DQS) 430 may also be provided to the memory array. An 8-bit data bus 435 may also be coupled with the memory array for transferring data to/from the memory array. As discussed above, a full memory command, including the command information, memory partition address, and memory location address, may be provided to the memory array over eight clock cycles of the C/A bus, with the end of the memory command indicated at 440 in the example of FIG. 4.

Figure 5:
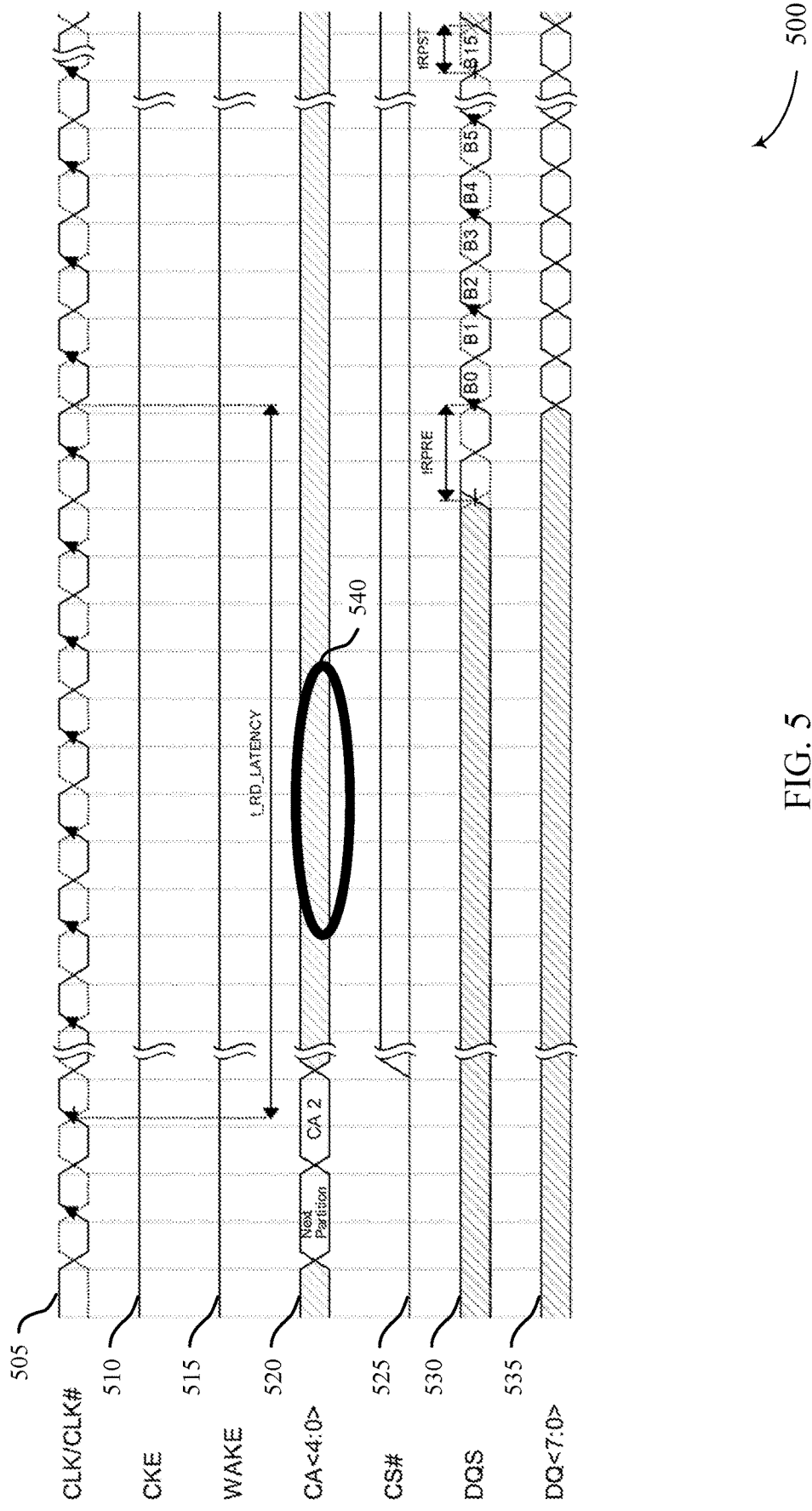
FIG. 5 illustrates an example of a timing diagram for control/address bus pins using a next partition command in accordance with various embodiments of the present disclosure.

FIG. 5 illustrates an example of a timing diagram 500 for control/address bus pins using a next partition command. Such a timing diagram 500 may represent timing associated with a memory array 110 of FIG. 1 or 2. As discussed with respect to FIG. 4, a clock (CK/CK #) signal 505 may be provided to the memory array, along with a clock enable (CKE) signal 510 and a wake signal 515. C/A bus signal 520, which is five bits wide, is also provided to the memory array. A chip select (CS #) signal 525, and data strobe (DQS) 530 may also be provided to the memory array. Again, an 8-bit data bus 535 may also be coupled with the memory array for transferring data to/from the memory array. In the example of FIG. 5, a next partition command may be provided to memory array over two clock cycles, thus allowing subsequent actions responsive to the next partition command to be initiated more quickly and in advance of the end of a full memory command and address transmission that would not be complete until the time indicated at 540 in the example of FIG. 5. Furthermore, in embodiments where the next partition command is performed on a next sequential partition and does not include a partition address, the command may be provided over one clock cycle.

Figure 6:
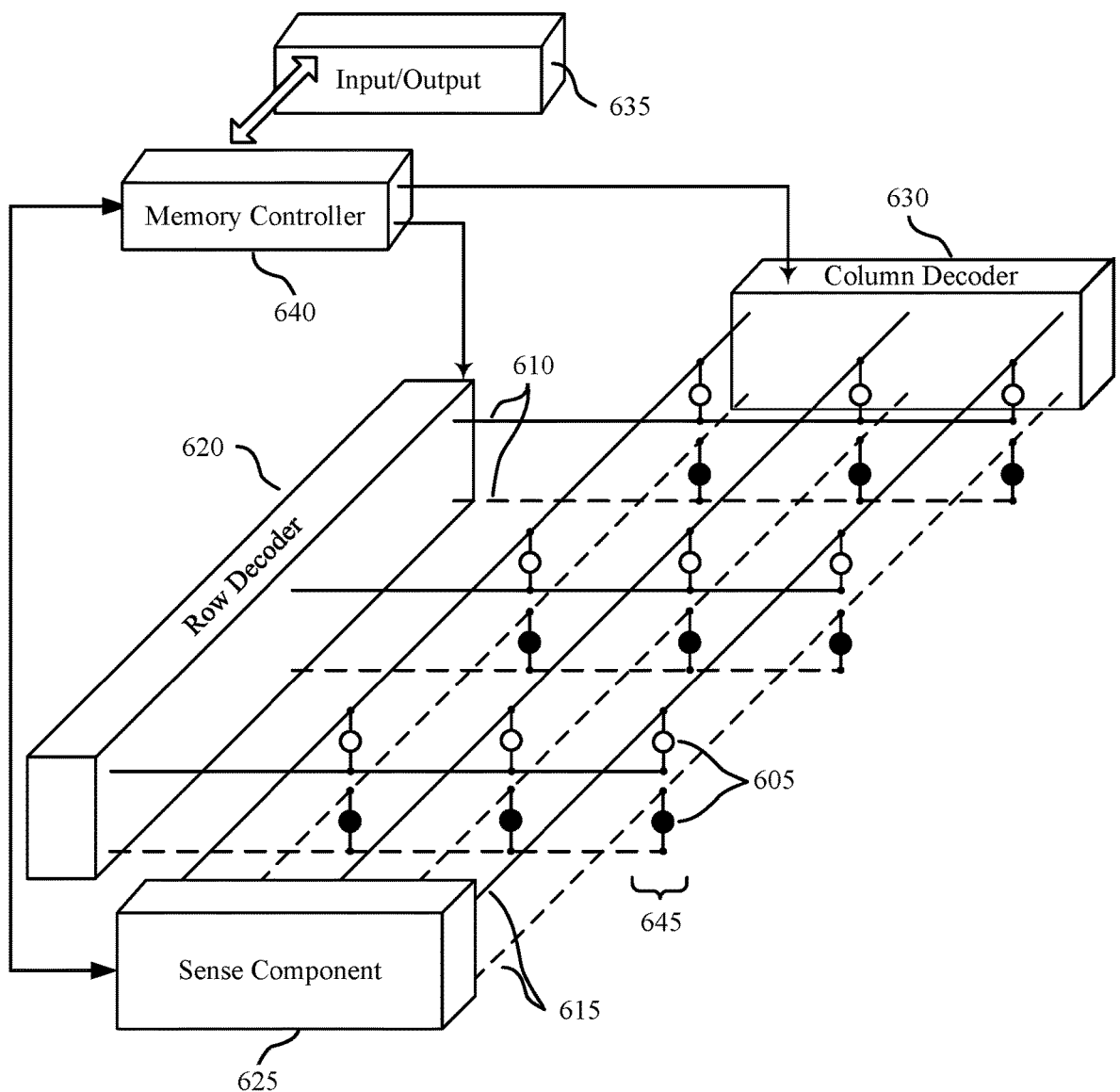
FIG. 6 illustrates an example 3D cross-point memory array that may be used in a memory device with multiple partitions in accordance with various embodiments of the present disclosure.

FIG. 6 illustrates an example memory array 600 in accordance with various embodiments of the present disclosure. Memory array 600 may also be referred to as an electronic memory apparatus. Memory array 600 may be an example of memory array 110 with reference to FIGS. 1-2. In the example of FIG. 6, a portion of a partition of a memory array 600 is illustrated, and other portions of partitions of the memory may have a similar architecture. As indicated above, in some embodiments the memory array 600 may be a 3DXP memory array. Memory array 600 includes memory cells 605 that are programmable to store different states. Each memory cell 605 may be programmable to store two states, denoted a logic 0 and a logic 1. In some cases, memory cell 605 is configured to store more than two logic states.

A memory cell 605 may include a material, which may be referred to as a memory element, that has a variable and configurable electrical resistance that is representative of the logic states. For example, a material with a crystalline or an amorphous atomic configuration may have different electrical resistances that correspond to a set or reset state (e.g., corresponding to logical 1 and 0 states). A voltage applied to the memory cell 605 may thus result in different currents depending on whether the material is in a set or reset state, and the magnitude of the resulting current may be used to determine the logic state stored by memory cell 605. In some cases, the memory cell 605 may have a combination of crystalline and amorphous areas that may result in intermediate resistances, which may correspond to different logic states (i.e., states other than logic 1 or logic 0) and may allow memory cells 605 to store more than two different logic states. As discussed below, the logic state of a memory cell 605 may be set by heating, including melting, the memory element.

Memory array 600 may be a three-dimensional (3D) memory array, where two-dimensional (2D) memory arrays are formed on top of one another in separate layers, levels, planes, or decks. The terms layer, level, plane, storage plane and deck may be used interchangeably to refer to a 2D memory array in a 3D memory of stacked 2D memory arrays. This may increase the number of memory cells that may be placed or created on a single die or substrate as compared with 2D arrays, which in turn may reduce production costs or increase the performance of the memory array, or both. According to the example depicted in FIG. 6, Memory array 600 includes two levels of memory cells 605 and may thus be considered a three-dimensional memory array; however, the number of levels is not limited to two. Each level may be aligned or positioned so that memory cells 605 may be approximately aligned with one another across each level, forming a memory cell stack 645. In some embodiments, memory addresses may be provided that include address bits for both a first layer and a second layer of a 3D memory array.

Each row of memory cells 605 is connected to a word line 610, and each column of memory cells 605 is connected to a bit line 615. Word lines 610 and bit lines 615 may also be known as access lines and in some cases, a bit line 615 may be referred to as a digit line. References to word lines and bit lines, or their analogues, are interchangeable without loss of understanding or operation. Word lines 610 and bit lines 615 may be substantially perpendicular to one another to create an array. As shown in FIG. 6, the two memory cells 605 in a memory stack 645 may share a common access line such as a digit line 615. That is, a digit line 615 may be in electronic communication with the bottom electrode of the upper memory cell 605 and the top electrode of the lower memory cell 605. Other configurations may be possible, for example, a third layer may share a word line 610 with a lower layer. In general, one memory cell 605 may be located at the intersection of two access lines such as a word line 610 and a bit line 615. This intersection may be referred to as a memory cell's address.

As discussed above, electrodes may be coupled to a memory cell 605 and a word line 610 or a bit line 615. The term electrode may refer to an electrical conductor, and in some cases, may be employed as an electrical contact to a memory cell 605. An electrode may include a trace, wire, conductive line, conductive layer, or the like that provides a conductive path between elements or components of memory array 600.

Operations such as reading and writing may be performed on memory cells 605 by activating or selecting a word line 610 and bit line 615, which may include applying a voltage or a current to the respective line. Word lines 610 and bit lines 615 may be made of conductive materials, such as metals (e.g., copper, aluminum, gold, tungsten, titanium, etc.), metal alloys, carbon, or other conductive materials, alloys, or compounds. Upon selecting a memory cell 605, the resulting signal may be used to determine the stored logic state. For example, a voltage may be applied and the resulting current may be used to differentiate between the resistive states of the memory cell.

Accessing memory cells 605 may be controlled through a row decoder 620 and a column decoder 630. For example, a row decoder 620 may receive a row address from the memory controller 640 and activate the appropriate word line 610 based on the received row address. Similarly, a column decoder 630 receives a column address from the memory controller 640 and activates the appropriate bit line 615. Thus, by activating a word line 610 and a bit line 615, a memory cell 605 may be accessed.

Upon accessing, a memory cell 605 may be read, or sensed, by sense component 625. For example, sense component 625 may be configured to determine the stored logic state of memory cell 605 based on a signal generated by accessing memory cell 605. The signal may include a voltage or electrical current, and sense component 625 may include voltage sense amplifiers, current sense amplifiers, or both. For example, a voltage may be applied to a memory cell 605 (using the corresponding word line 610 and bit line 615) and the magnitude of the resulting current may depend on the electrical resistance of the memory cell 605. Likewise, a current may be applied to a memory cell 605 and the magnitude of the voltage to create the current may depend on the electrical resistance of the memory cell 605. Sense component 625 may include various transistors or amplifiers in order to detect and amplify a signal, which may be referred to as latching. The detected logic state of memory cell 605 may then be output as output 635. In some cases, sense component 625 may be a part of column decoder 630 or row decoder 620. Or, sense component 625 may be connected to or in electronic communication with column decoder 630 or row decoder 620.

A memory cell 605 may be set, or written, by similarly activating the relevant word line 610 and bit line 615—i.e., a logic value may be stored in the memory cell 605. Column decoder 630 or row decoder 620 may accept data, for example input 635, to be written to the memory cells 605. In the case of phase change memory, a memory cell 605 is written by heating the memory element, for example, by passing a current through the memory element. This process is discussed in more detail below.

In some memory architectures, accessing the memory cell 605 may degrade or destroy the stored logic state and re-write or refresh operations may be performed to return the original logic state to memory cell 605. In DRAM, for example, the logic-storing capacitor may be partially or completely discharged during a sense operation, corrupting the stored logic state. So the logic state may be re-written after a sense operation. Additionally, activating a single word line 610 may result in the discharge of all memory cells in the row; thus, all memory cells 605 in the row may need to be re-written. But in non-volatile memory, such as PCM, accessing the memory cell 605 may not destroy the logic state and, thus, the memory cell 605 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile phase change memory cells may have beneficial properties that may result in improved performance relative to other memory architectures.

The memory controller 640 may control the operation (read, write, re-write, refresh, etc.) of memory cells 605 through the various components, for example, row decoder 620, column decoder 630, and sense component 625. In some cases, one or more of the row decoder 620, column decoder 630, and sense component 625 may be co-located with the memory controller 640. Memory controller 640 may generate row and column address signals in order to activate the desired word line 610 and bit line 615. Memory controller 640 may also generate and control various voltage potentials or currents used during the operation of memory array 600. In general, the amplitude, shape, or duration of an applied voltage or current discussed herein may be adjusted or varied and may be different for the various operations discussed in operating memory array 600. Furthermore, one, multiple, or all memory cells 605 within memory array 600 may be accessed simultaneously; for example, multiple or all cells of memory array 600 may be accessed simultaneously during a reset operation in which all memory cells 605, or a group of memory cells 605, are set to a single logic state. It is notes that, while a PCM memory array in 3DXP technology is described in detail in the present disclosure, the memory array may be implemented in any other (volatile or non-volatile) technology with the necessary operation adaptations (e.g., in signal amplitudes, shapes, timing, etc.).

Figure 7:
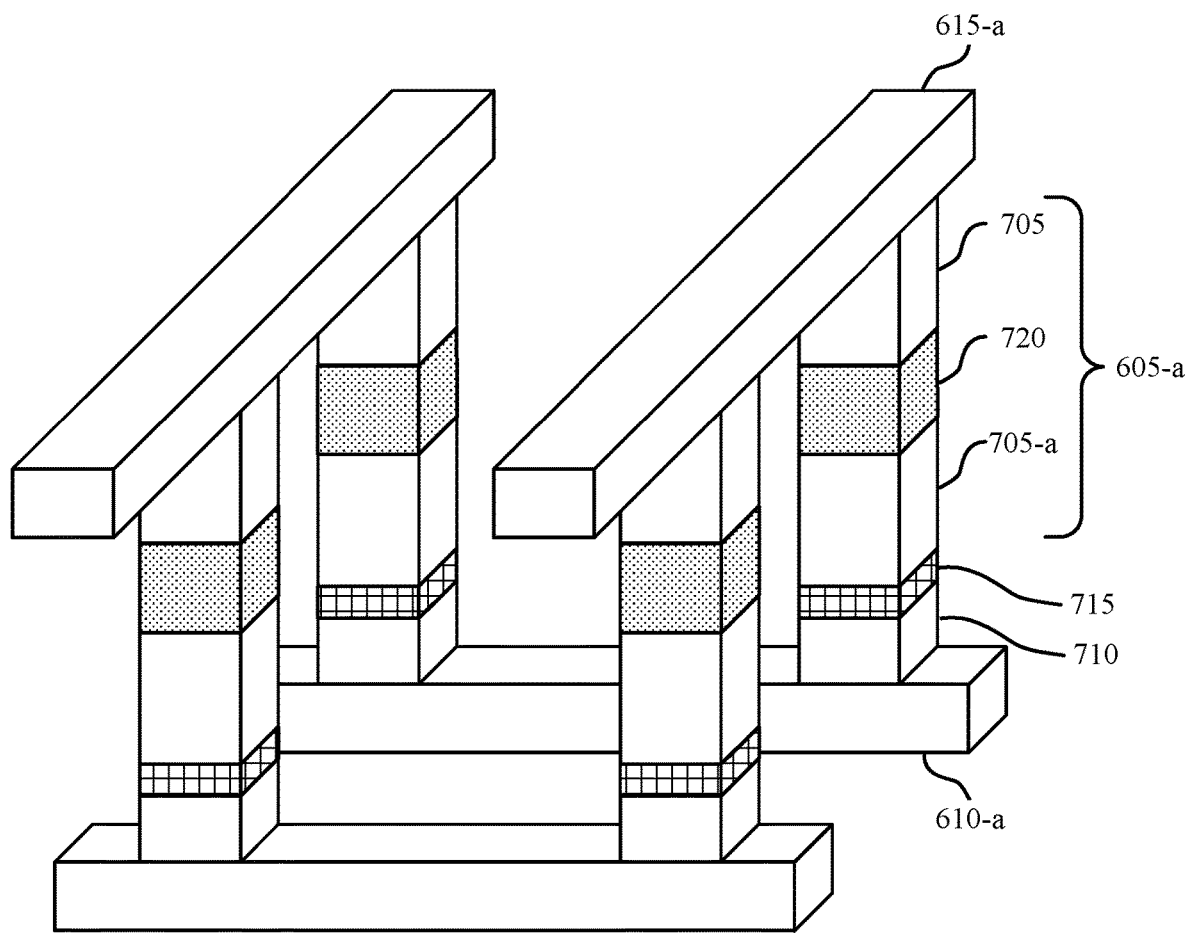
FIG. 7 illustrates an example memory array that may be used in a memory device with multiple partitions in accordance with various embodiments of the present disclosure.

FIG. 7 illustrates an example memory array 700 that supports memory access techniques in memory devices with multiple partitions, in accordance with various embodiments of the present disclosure. Memory array 700 may be an example of memory array 110 or 600 with reference to FIGS. 1-2 and 6. Memory array 700 includes memory cells 605-a, word lines 610-a, and bit lines 615-a, which may be examples of a memory cell 605, word line 610, and bit line 615, as described with reference to FIG. 6. Memory cell 605-a includes electrode 705, electrode 705-a, and memory element 720. Memory array 700 also includes bottom electrode 710 and selection component 715. In some cases, a 3D memory array may be formed by stacking multiple memory arrays 700 on one another. In some cases, the two stacked arrays may have common access lines such that each level may share word lines 610 or bit lines 615 as described with reference to FIG. 6. As described above, various logic states may be stored by programming the electrical resistance of memory element 720. In some cases, this may include passing a current through memory cell 605-a, heating memory cell 605-a, or melting memory element 720 wholly or partially.

Memory array 700 may be made by various combinations of material formation and removal. For example, layers of material may be deposited that correspond to the word line 610-a, bottom electrode 710, selection component 715, electrode 705-a, memory element 720, and electrode 705. Material may be selectively removed to then create the desired features, such as the pillar structure depicted in FIG. 7. For example, features may be defined using photolithography to pattern a photoresist and then material may be removed by techniques such as etching. Bit lines 615-a may then be formed, for example, by depositing a layer of material and selectively etching to form the line structure depicted in FIG. 7. In some cases, electrically insulating regions or layers may be formed or deposited. The electrically insulating regions may include oxide or nitride materials, such as silicon oxide, silicon nitride, or other electrically insulating materials.

Selection component 715 may, in some cases, be connected in series between a memory cell 605-a and at least one conducive line such as a word line 610-a or a bit line 615-a. For example, as depicted in FIG. 7, selection component 715 may be located between electrode 705-a and bottom electrode 710; thus, selection component 715 is located in series between memory cell 605-a and word line 610-a. Other configurations are possible. For example, selection component may be located in series between memory cell 605-a and bit line 615-a. The selection component may aid in selecting a particular memory cell 605-a or may help prevent stray currents from flowing through non-selected memory cells 605-a adjacent a selected memory cell 605-a. The selection component may include an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, the selection component is a chalcogenide film. The selection component may, in some examples, be an alloy of selenium, arsenic, and germanium.

Various techniques may be used to form materials or components of memory array 700. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 605-a of FIG. 7 may include memory element 720 that has a variable resistance. Variable resistance materials may refer to various material systems, including, for example, metal oxides, chalcogenides, and the like. Chalcogenide materials are materials or alloys that include at least one of the elements sulfur (S), selenium (Se), or tellurium (Te). Many chalcogenide alloys may be possible—for example, a germanium-antimony-tellurium alloy (Ge—Sb—Te) is a chalcogenide material. Other chalcogenide alloys not expressly recited here may also be employed.

Phase change memory exploits the large resistance contrast between crystalline and amorphous states in phase change materials, which may be chalcogenide materials. A material in the crystalline state may have atoms arranged in a periodic structure, which may result in a relatively low electrical resistance. By contrast, material in an amorphous state may have no or relatively little periodic atomic structure, which may have a relatively high electrical resistance. The difference in resistance values between amorphous and crystalline states of a material may be significant; for example, a material in an amorphous state may have a resistance one or more orders of magnitude greater than the resistance of the material in its crystalline state. In some cases, the material may be partially amorphous and partially crystalline, and the resistance may be of some value between the resistances of the material in a wholly crystalline or wholly amorphous state. So a material may be used for other than binary logic applications—i.e., the number of possible states stored in a material may be more than two.

To set a low-resistance state, a memory cell 605-a may be heated by passing a current through the memory cell. Heating caused by electrical current flowing through a material that has a finite resistance may be referred to as Joule or ohmic heating. Joule heating may thus be related to the electrical resistance of electrodes or phase change material. Heating the phase change material to an elevated temperature (but below its melting temperature) may result in the phase change material crystallizing and forming the low-resistance state. In some cases, memory element 720 may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

Figure 8:
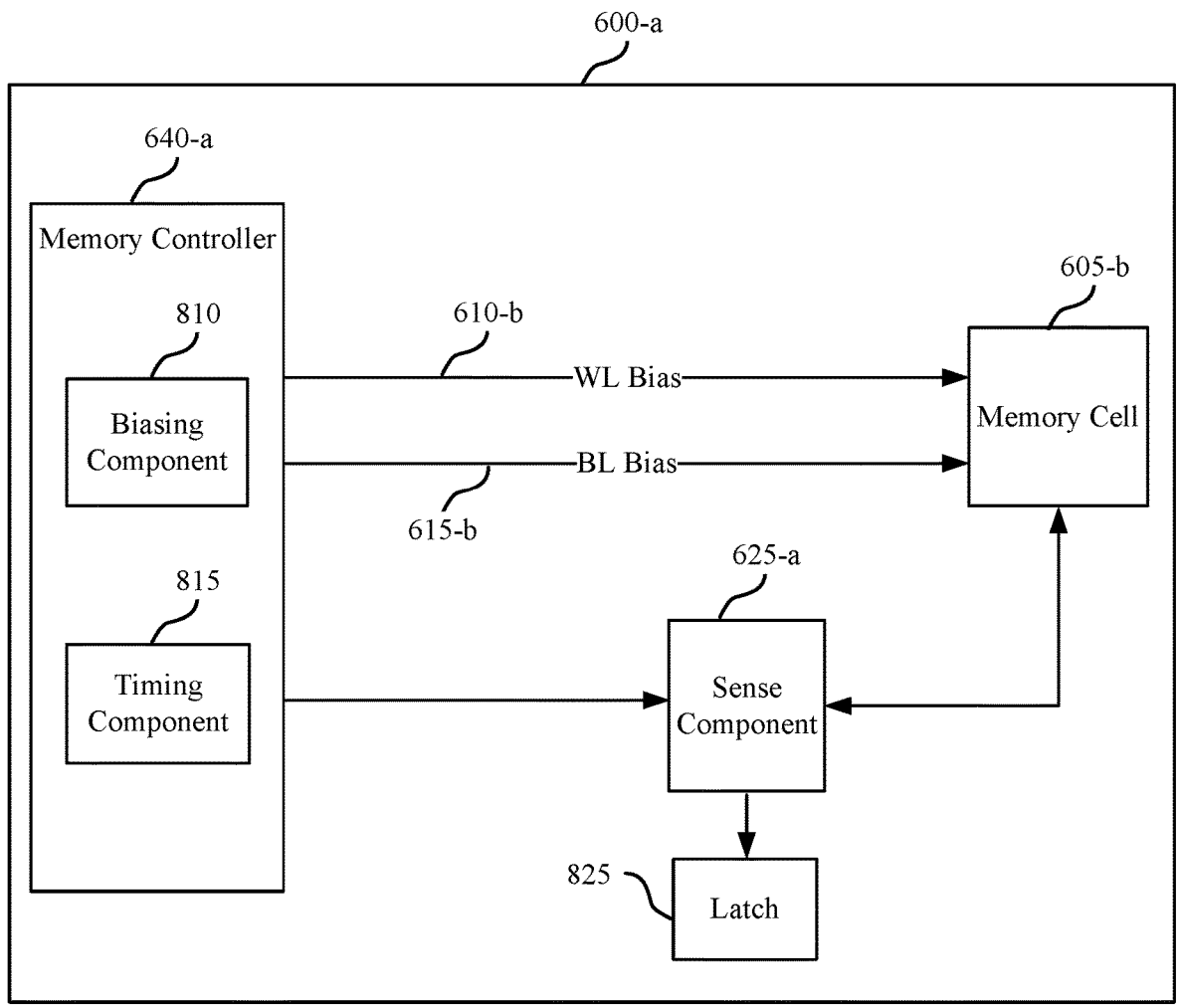
FIG. 8 illustrates a block diagram of a memory array that may be used in a memory device with multiple partitions in accordance with various embodiments of the present disclosure.

FIG. 8 shows a block diagram 800 of a memory array 600-a that supports memory access techniques in memory devices with multiple partitions, in accordance with various embodiments of the present disclosure. Memory array 600-a may be referred to as an electronic memory apparatus and may include memory controller 640-a and memory cell 605-b, which may be examples of memory controllers 150 or 640 and memory cells 160 or 605 described with reference to FIGS. 1, 2, 6 and 7. Memory controller 640-a includes biasing component 810 and timing component 815 and may operate memory array 600-*a* as described in FIGS. 1, 2, 6, and 7. Memory controller 640-*a* may be in electronic communication with word line 610-*b*, bit line 615-*b*, and sense component 625-*a*, which may be examples of word line 610, bit line 615, and sense component 625, described with reference to FIG. 6 or 7. Memory array 600-*a* may also include latch 825. The components of memory array 600-*a* may be in electronic communication with one another and may perform the functions described with reference to FIGS. 1 through 7. In some cases, sense component 625-*a* and latch 825 may be components of memory controller 640-*a*.

Memory controller 640-*a* may be configured to activate word line 610-*b* or bit line 615-*b* by applying voltages or currents to those various nodes. For example, biasing component 810 may be configured to apply a voltage to operate memory cell 605-*b* to read or write memory cell 605-*b* as described above. The applied voltage may be based on a desired current to be applied as well as the resistance of memory cell 605-*b* and any electrodes. In some cases, memory controller 640-*a* may include a row decoder, column decoder, or both, as described with reference to FIG. 6. This may enable memory controller 640-*a* to access one or more memory cells 605-*b*. Biasing component 810 may also provide voltages to operate sense component 625-*a*.

In some cases, memory controller 640-*a* may perform its operations using timing component 815. For example, timing component 815 may control the timing of the various word line or bit line selections, including timing for switching and voltage application to perform the memory functions, such as reading and writing, discussed herein. In some cases, timing component 815 may control the operations of biasing component 810.

Sense component 625-*a* may include voltage or current sense amplifiers to determine the stored logic state in memory cell 605-*b*. Upon determining the logic state, sense component 625-*a* may then store the output in latch 825, where it may be used in accordance with the operations of an electronic device using memory array 600-*a*.

Figure 9:
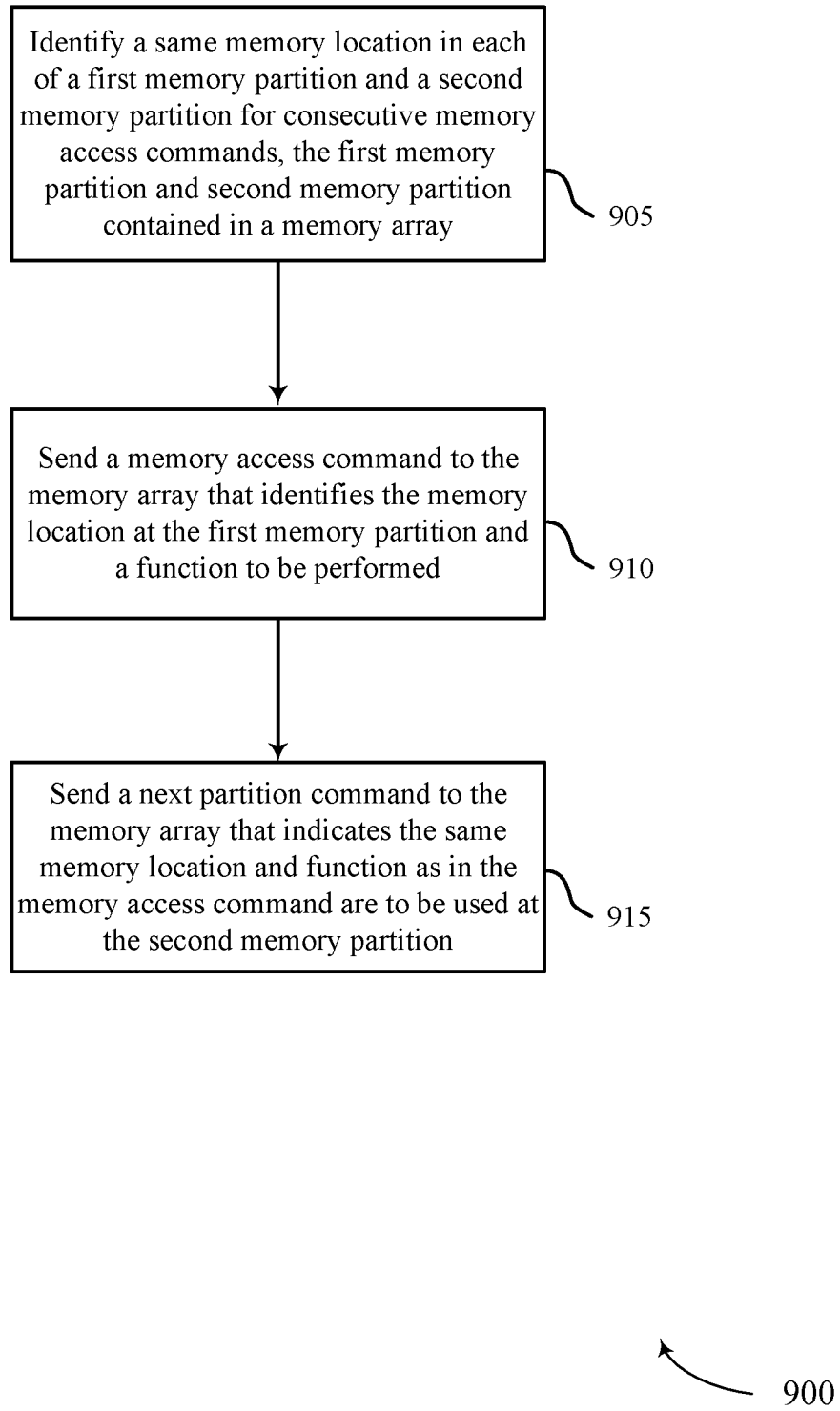
FIGS. 9-10 are flowcharts that illustrate memory access methods in memory devices with multiple partitions in accordance with various embodiments of the present disclosure.

FIG. 9 shows a flowchart illustrating a method 900 of operating a memory device in accordance with various embodiments of the present disclosure. The operations of method 900 may be implemented using a memory array 110 or 600 as described with reference to FIGS. 1-2, 6, and 8. For example, the operations of method 900 may be performed by a processor 115 in conjunction with memory controller 150 or 640 as described with reference to FIGS. 1-2, 6, and 8. In some examples, a processor 115 may execute a set of codes to control the functional elements of the memory array 110 or 600 to perform the functions described below. Additionally or alternatively, a memory controller may perform some or all of the functions described below using special-purpose hardware.

At block 905, the method may include identifying a same memory location in each of a first memory partition and a second memory partition for consecutive memory access commands, the first memory partition and second memory partition contained in a memory array, as described with reference to FIGS. 1-5. In certain examples, the operations of block 905 may be performed by the processor 115 of FIG. 1, in conjunction with memory controller 150 or 640 as described with reference to FIGS. 1-2, 6, and 8. In some embodiments, data may be written to a memory array in consecutive write operations to a same memory location in multiple consecutive partitions, and the same memory location in each of the first memory partition and second memory partition may be identified based on such consecutive write commands. Similarly, in some embodiments, data may be read from a memory array in consecutive read operations from a same memory location in multiple consecutive partitions, and the same memory location in each of the first memory partition and second memory partition may be identified based on such consecutive read commands.

At block 910, the method may include sending a memory access command to the memory array that identifies the memory location at the first memory partition and a function to be performed, as described with reference to FIGS. 1-5. In certain examples, the operations of block 910 may be performed by the processor 115 of FIG. 1, in conjunction with memory controller 150 or 640 as described with reference to FIGS. 1-2, 6, and 8.

At block 915, the method may include sending a next partition command to the memory array that indicates the same memory location and function as in the memory access command are to be used at the second memory partition, as described with reference to FIGS. 1-5. In some examples, the next partition command may include a partition address at which the command is to be performed. In other examples, the next partition command may be performed on a next sequential partition address and thus the command may not include a partition address. In certain examples, the operations of block 915 may be performed by the processor 115 of FIG. 1, in conjunction with memory controller 150 or 640 as described with reference to FIGS. 1-2, 6, and 8. In some embodiments, a first number of clock cycles to send the memory access command is greater than a second number of clock cycles to send the next partition command.

Figure 10:
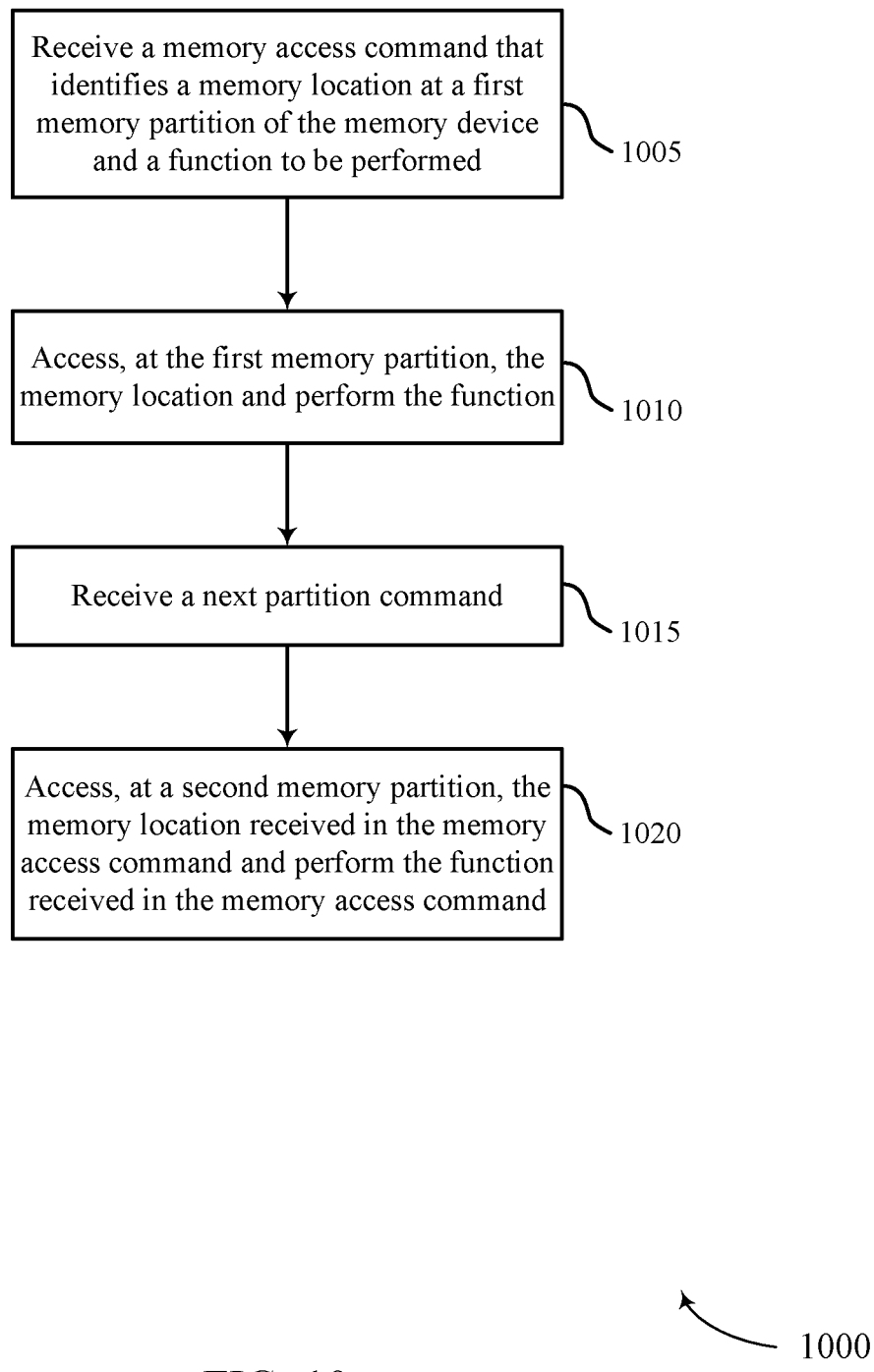

FIG. 10 shows a flowchart illustrating a method 1000 of operating a memory device in accordance with various embodiments of the present disclosure. The operations of method 1000 may be implemented by a memory array 110 or 600 as described with reference to FIGS. 1-2, 6, and 8. For example, the operations of method 1000 may be performed by a memory controller 150 or 640 as described with reference to FIGS. 1-2, 6, and 8. In some examples, a memory controller 150 or 640 may execute a set of codes to control the functional elements of the memory array 110 or 600 to perform the functions described below. Additionally or alternatively, a memory controller may perform some or all of the functions described below using special-purpose hardware.

At block 1005, the method may include receiving a memory access command that identifies a memory location at a first memory partition of the memory device and a function to be performed, as described with reference to FIGS. 1-5. In certain examples, the operations of block 1005 may be performed by the memory controller 150 or 640 as described with reference to FIGS. 1-2, 6, and 8.

At block 1010, the method may include accessing, at the first memory partition, the memory location and performing the function, as described with reference to FIGS. 1-5. In certain examples, the operations of block 1010 may be performed by the memory controller 150 or 640 as described with reference to FIGS. 1-2, 6, and 8.

At block 1015, the method may include receiving a next partition command, as described with reference to FIGS. 1-5. In certain examples, the operations of block 1015 may be performed by the memory controller 150 or 640 as described with reference to FIGS. 1-2, 6, and 8. In some embodiments, a first number of clock cycles to receive the memory access command is greater than a second number of clock cycles to receive the next partition command.

At block 1020, the method may include accessing, at a second memory partition, the memory location received in the memory access command and performing the function received in the memory access command, as described with reference to FIGS. 1-5. In certain examples, the operations of block 1020 may be performed by the memory controller 150 or 640 as described with reference to FIGS. 1-2, 6, and 8.

Thus, methods 900 and 1000 may provide efficient operations for memory arrays that include multiple partitions. It should be noted that methods 900 and 1000 describe possible implementations, and the operations and steps may be rearranged or otherwise modified such that other implementations are possible. In some examples, features or steps from the methods 900 and 1000 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

As used herein, 'coupled to' indicates components that are substantially in contact with one another. In some cases, two components may be coupled even if a third material or component physically separates them. This third component may not substantially alter the two components or their functions. Instead, this third component may aid or enable the connection of the first two components. For example, some materials may not strongly adhere when deposited on a substrate material. Thin (e.g., on the order of a few nanometers or less) layers, such as lamina layers, may be used between two materials to enhance their formation or connection. In other cases, a third material may act as a buffer to chemically isolate two components.

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 600.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" refers to a relationship between components that supports electron flow between the components. This may include a direct connection between components or may include intermediate components. Components in electronic communication may be actively exchanging elections or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The devices discussed herein, including memory array 600, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. A portion or cut of a substrate containing a memory array or circuit may be referred to as a die.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

Transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. Likewise, if the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method of operating a memory system, comprising:
   identifying a same memory location in each of a first memory partition and a second memory partition for consecutive memory access commands, the first memory partition and the second memory partition contained in a memory array;
   sending a memory access command to the memory array that identifies the memory location at the first memory partition and a function to be performed; and sending, subsequent to sending the memory access command, a next partition command to the memory array that indicates the same memory location and function as in the memory access command are to be used at the second memory partition, wherein the next partition command sent to the memory array comprises a partition address of the second memory partition and excludes a memory address of the memory location of the second memory partition, and wherein the partition address comprises a number of bits indicating the second memory partition to be accessed, the number of bits based at least in part on a number of partitions in the memory array.

2. The method of claim 1, wherein the memory array comprises a three-dimensional cross-point memory array, and wherein the method further comprises:
identifying the memory location as a first address at a first storage plane within the first memory partition of the three-dimensional cross-point memory array and a second address at a second storage plane within the first memory partition of the three-dimensional cross-point memory array.

3. The method of claim 1, wherein a first number of clock cycles to send the memory access command is greater than a second number of clock cycles to send the next partition command.

4. The method of claim 3, wherein the first number of clock cycles is eight clock cycles, and the second number of clock cycles is two clock cycles.

5. The method of claim 1, wherein the memory array is selected from a group consisting of dynamic random access memory (DRAM), non-volatile random access memory (NVRAM), read only memory (ROM), and three-dimensional cross-point memory.

6. A method of operating a memory device, comprising:
receiving, at the memory device, a memory access command that identifies a memory location at a first memory partition of the memory device and a function to be performed;
accessing, at the first memory partition, the memory location and performing the function;
receiving, at the memory device and subsequent to the memory access command, a next partition command, wherein the next partition command received at the memory device comprises a partition address of a second memory partition and excludes a memory address of the memory location of the second memory partition, and wherein the partition address comprises a number of bits indicating the second memory partition to be accessed, the number of bits based at least in part on a number of partitions in a memory array of the memory device; and
accessing, at the second memory partition of the memory device, the memory location received in the memory access command and performing the function received in the memory access command, wherein the second memory partition and the first memory partition are in the memory array of the memory device.

7. The method of claim 6, wherein the memory device comprises a three-dimensional cross-point memory array, and wherein the memory location comprises a first address at a first storage plane within the first memory partition of the three-dimensional cross-point memory array and a second address at a second storage plane within the first memory partition of the three-dimensional cross-point memory array.

8. The method of claim 6, wherein a first number of clock cycles to receive the memory access command is greater than a second number of clock cycles to receive the next partition command.

9. The method of claim 8, wherein the first number of clock cycles is eight clock cycles, and the second number of clock cycles is two clock cycles.

10. The method of claim 6, wherein the memory array is selected from a group consisting of dynamic random access memory (DRAM), non-volatile random access memory (NVRAM), read only memory (ROM), and three-dimensional cross-point memory.

11. An apparatus for data transfer, comprising:
a memory array coupled with a control/address (C/A) bus and a data bus, the memory array comprising a plurality of memory partitions including at least a first memory partition and a second memory partition; and
a controller coupled with the C/A bus and the data bus in electronic communication with the memory array, wherein the controller is operable to:
identify a same memory location in each of the first memory partition and the second memory partition for consecutive memory access commands;
send, via the C/A bus, a memory access command to the memory array that identifies the memory location at the first memory partition and a function to be performed;
receive, via the data bus, data associated with the memory location at the first memory partition; and
send, via the C/A bus and subsequent to the memory access command, a next partition command to the memory array that indicates the same memory location and function as in the memory access command are to be used at the second memory partition, wherein the next partition command sent to the memory array comprises a partition address of the second memory partition and excludes a memory address of the memory location of the second memory partition, and wherein the partition address comprises a number of bits indicating the second memory partition to be accessed, the number of bits based at least in part on a number of partitions in the memory array.

12. The apparatus of claim 11, wherein the memory array comprises a three-dimensional cross-point memory array, and wherein the controller is further operable to:
identify the memory location as a first address at a first storage plane within the first memory partition of the three-dimensional cross-point memory array and a second address at a second storage plane within the first memory partition of the three-dimensional cross-point memory array.

13. The apparatus of claim 11, wherein a first number of C/A bus clock cycles to send the memory access command is greater than a second number of C/A bus clock cycles to send the next partition command.

14. The apparatus of claim 13, wherein the first number of C/A bus clock cycles is eight clock cycles, and the second number of C/A bus clock cycles is two clock cycles.

15. The apparatus of claim 11, wherein the memory array is selected from a group consisting of dynamic random access memory (DRAM), non-volatile random access memory (NVRAM), read only memory (ROM), and three-dimensional cross-point memory.

16. The apparatus of claim 11, further comprising:
an operation instruction decoder configured to decode a received instruction as the next partition command, wherein the controller is configured to decode an initial received instruction that includes at least one of a first memory address, a previous memory location of the first memory partition, a first memory partition identification, or the memory access command.

17. The apparatus of claim 11, wherein the memory array comprises a three-dimensional cross-point memory array.

18. The method of claim 1, wherein one or more sequential memory partitions are located between the first memory partition and the second memory partition.

19. The method of claim 6, wherein one or more sequential memory partitions of the memory array are located between the first memory partition and the second memory partition.

20. The apparatus of claim 11, wherein one or more sequential memory partitions of the memory array are located between the first memory partition and the second memory partition.

* * * * *